United States Patent [19]
Tadokoro et al.

[11] Patent Number: 6,060,745
[45] Date of Patent: May 9, 2000

[54] SEMICONDUCTOR DEVICE HAVING A MONOTONICALLY DECREASING IMPURITY CONCENTRATION

[75] Inventors: Chihiro Tadokoro; Junichi Yamashita, both of Tokyo, Japan

[73] Assignee: Mitsubishi Denki Kabushiki Kaisha, Tokyo, Japan

[21] Appl. No.: 09/003,359

[22] Filed: Jan. 6, 1998

[30] Foreign Application Priority Data

Aug. 25, 1997 [JP] Japan ................................. 9-228035

[51] Int. Cl.[7] ........................ H01L 29/94; H01L 31/062; H01L 31/113; H01L 31/119
[52] U.S. Cl. ........................ 257/329; 257/655; 438/138; 438/269; 438/923
[58] Field of Search ................ 457/329, 655–7; 438/138, 268, 269, 923

[56] References Cited

U.S. PATENT DOCUMENTS

| | | | |
|---|---|---|---|
| 4,181,538 | 1/1980 | Narayan et al. | 257/655 |
| 5,057,884 | 10/1991 | Suzuki et al. | 257/144 |
| 5,453,390 | 9/1995 | Nishizawa et al. | 438/138 |
| 5,688,725 | 11/1997 | Darwish et al. | 438/270 |
| 5,696,396 | 12/1997 | Tokura et al. | 257/341 |
| 5,879,967 | 3/1999 | Kim | 438/133 |

*Primary Examiner*—Olik Chaudhuri
*Assistant Examiner*—Howard Weiss
*Attorney, Agent, or Firm*—Oblon, Spivak, McClelland, Maier & Neustadt, P.C.

[57] ABSTRACT

An $n^-$ layer (2E) having a low impurity concentration is epitaxially grown on a surface (S1) of an $n^+$ silicon substrate (1) having a high impurity concentration to a depth (D), and phosphorus ions (P) are implanted from the surface (S1) to the inside of the $n^-$ layer (2E). A $SiO_2$ film is formed on the surface S1 by thermal oxidation, and an opening hole is formed in the $SiO_2$ film. Using the opening hole, p-type impurities are implanted and diffused by thermal oxidation in the ion-implanted $n^-$ layer (2E), forming a p-type diffusion layer (well) from the surface (S1) to a predetermined depth. In this way, an n layer is formed in place of the $n^-$ layer (2E). The concentration distribution of impurity in the n layer monotonically decreases from the side of the surface (S1) and reaches its minimum on the side of an interface (BS). Then, a predetermined electrode is formed, completing the device. Thus, variations in both on-state resistance and breakdown voltage are reduced in a semiconductor device having a pn junction.

4 Claims, 17 Drawing Sheets

# SEMICONDUCTOR DEVICE HAVING A MONOTONICALLY DECREASING IMPURITY CONCENTRATION

BACKGROUND OF THE INVENTION

1. Field of the Invention

The present invention is directed to a semiconductor device and a manufacturing method thereof, especially to a semiconductor device having a pn junction, and to a technique for further reducing variations in breakdown voltage and on-state resistance in a device such as a diode or a vertical MOSFET.

2. Background of the Invention

A conventional manufacturing method of the vertical MOSFET having a breakdown voltage of 60 V or less will be described with reference to figures. FIGS. 21 through 32 are longitudinal sectional views illustrating the conventional manufacturing process.

First, an n$^+$ silicon substrate 10 having a high impurity concentration is prepared (FIG. 21). Then, an n layer 11 having a low impurity concentration is epitaxially grown from a first major surface 10S1 of the silicon substrate 10 to the inside thereof to a thickness D (FIG. 22). On a first major surface 11S1 of the n layer 11, a SiO$_2$ film 18 is formed by thermal oxidation (FIG. 23). After an opening hole 19 is formed in the SiO$_2$ film 18, a P-type impurity is ion-implanted into the n layer 11 by utilizing the opening hole 19 (FIG. 24). The implanted impurity is diffused (FIG. 25), and a P-type impurity region 12 is formed by removing the SiO$_2$ film 18 (FIG. 26).

Further, a gate oxide film 13 is formed by thermal oxidation (FIG. 27), and a polycrystalline silicon layer 14 to be a gate electrode is formed on the surface of the gate oxide film 13 (FIG. 28). An n$^+$ source impurity region 15 having a high impurity concentration is selectively formed from the surface of the P-type impurity region 12 to a predetermined depth (FIG. 29). Then, an interlayer insulation film 16 is selectively formed on the exposed faces of the polycrystalline silicon layer 14 and on a surface portion of the n$^+$ layer 15 on the side of the gate oxide film 13, so as to coat the gate oxide film 13 and the polycrystalline silicon layer 14 (FIG. 30). Further, a source electrode 17 is formed on the surface of the interlayer insulation film 16 and on the exposed portion of the first major surface of the n layer 11 (FIG. 31), while a drain electrode 20 is formed on a second major surface 10S2 of the n$^+$ silicon substrate 10 (FIG. 32).

Next, the operation of the vertical MOSFET of FIG. 32 will be described.

When a positive gate voltage is applied to the polycrystalline silicon layer 14 to be a gate electrode, electrons are induced inside the surface of the P-type impurity region 12 just below the gate oxide film 13. If the gate voltage is further increased, an n-type channel region is narrowly formed. If a positive voltage is applied to the drain electrode 20) at this time, the layers 11 and 15 become conductive, by which an electron current flows from the source electrode 17 to the drain electrode 20.

This electron current is related to the impurity concentration and thickness of the n layer 11. Since impurity concentration is expressed by resistivity, the electron current depends on the resistivity and thickness of the n layer 11. Thus, the on-state resistance generated by a rated electron current flowing through each of the layers 15, 12, 11, 10, depends on the resistivity and thickness of the n layer 11.

There is a depletion layer region at a pn junction of the semiconductor device, and the width of the depletion layer region is related to the impurity concentration and thickness both of the p-type and n-type regions. The breakdown voltage between the pn junction is also related to the impurity concentration and thickness of the p-type and n-type regions, because it depends on the electric field generated by the voltage applied to the depletion layer region. Especially for the vertical MOSFET of FIG. 32, since the depletion layer region basically extends to a region of low impurity concentration, the breakdown voltage between the source electrode 17 and the drain electrode 20 is closely related to the impurity concentration (or resistivity) and thickness of the n layer 11.

Since the conventional vertical MOSFET with a breakdown voltage of 60 V or less has such a structure as described above, variations in impurity concentration and thickness of the n layer on the drain side cause variations in characteristics such as on-state resistance or breakdown voltage dependent on the resistivity and thickness of the n layer. Further, in the conventional technique, the epitaxial growth of the n layer (FIG. 22) in element manufacture inevitably causes about ±10% variations in resistivity and thickness, which cannot be ignored. Besides, the thermal treatment in the element manufacture causes a float of a high concentration of impurity from the n-type silicon substrate, which substantially reduces the thickness D of FIG. 22 and thereby increases resistivity. Therefore, the relation of the thickness D of FIG. 22 and the thickness DIP of FIG. 32 can be expressed as D>DIP. Here, the term "float" indicates that, in FIG. 32, for example, some of the n-type impurity in the n$^+$ layer 10 is diffused in the n layer 11 so that the n$^+$ layer 10 extends to the n layer 11. This increases the impurity concentration of the n layer 11 as indicated by the broken line BC of FIG. 20.

First, if the resistivity of the n layer varies upward in the epitaxial growth of the n layer and is further increased due to the float of a high concentration of impurity from the n-type silicon substrate, the on-state resistance becomes higher than the desired value. That is, the resistivity ρ becomes ρ+α due to the epitaxial growth, and further becomes ρ+α+β due to the float of a high concentration of impurity, reducing the thickness D of the n layer. At this time, since the increase in on-state resistance due to the increase in resistivity ρ is greater than the reduction in on-state resistance due to the reduction in thickness D, the on-state resistance is increased. On the other hand, the breakdown voltage is not reduced.

Secondly, if the resistivity of the n layer varies downward in the epitaxial growth of the n layer, and further the thickness of the n layer is reduced due to the float of a high concentration of impurity from the n type silicon substrate, the breakdown voltage is reduced. In this case, the resistivity does not change, so that the reduction in thickness D comes to have a great effect. Thus, not the increase in on-state resistance but the reduction in breakdown voltage introduces a problem.

The above-described problem that the variations in resistivity and thickness of the n layer causes the variations in characteristics such as on-state resistance and breakdown voltage, is especially significant for the vertical MOSFET having a breakdown voltage of 60 V or less, but may also arise for the vertical MOSFET having a breakdown voltage of more than 60 V, and for a pin-structured diode to be used as a free wheeling diode in a power module.

SUMMARY OF THE INVENTION

A first aspect of the present invention is directed to a semiconductor device comprising: a first semiconductor` layer of a first conductivity type having a first impurity concentration, the first semiconductor layer having a first major surface and a second major surface opposed to the first major surface; a second semiconductor layer of the first conductivity type having a second impurity concentration lower than the first impurity concentration, the second semiconductor layer having a third major surface providing an interface with the second major surface, and a fourth major surface opposed to the third major surface; a well of a second conductivity type provided from a part of the fourth major surface to a predetermined depth inside the second semiconductor layer; a first main electrode provided on the first major surface; and a second main electrode provided on a surface of the well. In the semiconductor device, the second impurity concentration of the second semiconductor layer except the well distributes in a depth direction, decreasing monotonically from the side of the fourth major surface and reaching its minimum on the side of the interface.

Preferably, according to a second aspect of the present invention, the concentration distribution of impurity from the surface of the well to the interface just below the well shows a first maximum on the side of the surface of the well, a first minimum at a bottom of the well, a second maximum on the side of the bottom within the second semiconductor layer, and a second minimum on the side of the interface within the second semiconductor layer.

Preferably, according to a third aspect of the present invention, the semiconductor device further comprises: a third semiconductor layer of the second conductivity type provided from a part of the surface of the well including a first portion providing an interface with an edge portion of the second main electrode and a part of a second portion which is adjacent to the first portion and on which the second main electrode is not provided, to the inside of the well; an insulation film provided on the other part of the second portion sandwiched between the third semiconductor layer and an edge portion of the well, out of the surface of the well; and a conductive layer provided on the insulation film.

A fourth aspect of the present invention is directed to a semiconductor device comprising: a first main electrode; a first semiconductor layer of a first conductivity type having a first impurity concentration, formed on the first main electrode; a second semiconductor layer of the first conductivity type having a second impurty concentration, formed on the first semiconductor layer; a diffusion layer of a second conductivity type, selectively formed from a surface of the second semiconductor layer to the inside thereof; and a second main electrode formed on a surface of the diffusion layer. In the semiconductor device, the second impurity concentration is lower than the first impurity concentration; the second semiconductor layer is mainly formed of an epitaxial growth layer, and comprises a predetermined impurity of the first conductivity type implanted in the epitaxial growth layer by ion implantation; and the diffusion layer is formed in the second semiconductor layer comprising the predetermined impurity, by means of diffusion.

A fifth aspect of the present invention is directed to a method for manufacturing semiconductor device comprising: a first step of providing a first semiconductor layer of a first conductivity type having a first impurity concentration; a second step of epitaxially growing a second semiconductor layers of the first conductivity type having a second impurity concentration, in the first semiconductor layer; and a third step of changing impurity concentration of the second semiconductor layer from the second impurity concentration to a third impurity concentration by implanting and diffusing predetermined impurities of the first conductivity type only in the second semiconductor layer, wherein the first impurity concentration is higher than the third impurity concentration, and the third impurity concentration is higher than the second impurity concentration.

Preferably, according to a sixth aspect of the present invention, the third step comprises: an ion-implantation step of implanting the predetermined impurities from a surface of the second semiconductor layer; and a diffusion step of forming a well of a second conductivity type from the surface of the second semiconductor layer after ion implantation, to the inside thereof by means of diffusion.

Preferably, according to a seventh aspect of the present invention, the method for manufacturing a semiconductor device further comprises: a fourth step of forming a third semiconductor layer of the first conductivity type from the surface of the well to the inside thereof, and sequentially forming an insulation film and a conductive layer on the surface of the well sandwiched between the third semiconductor layer and an edge portion of the well.

In accordance with the first and third aspects of the present invention, since the concentration distribution of impurity in the second semiconductor layer monotonically decreases from the surface of the fourth major surface and reaches its minimum on the side of the interface, the influence of the impurity of the first conductivity type floating from the first semiconductor layer having a high impurity concentration to the second semiconductor layer, more specifically, the substantial reduction in thickness and the resultant increase in resistivity of the second semiconductor layer, can be sufficiently suppressed compared to the conventional semiconductor structure. Thus, it is possible to further prevent broth the increase in on-state resistance of a charged current flowing between the first and second semiconductor layers and the well with the voltage applied to a portion between the first and second main electrodes, and the reduction in breakdown voltage in a pn junction portion between the well and the second semiconductor layer.

In accordance with the second aspect of the present invention, it is possible to obtain a desired concentration distribution of impurity of the first conductivity type in the second semiconductor layer, with a proper concentration distribution of impurity of the second conductivity type kept in the well.

Further, in accordance with the third aspect of the present invention, it is possible to effectively prevent the influence of the impurity of the first conductivity type floating from the first semiconductor layer to the second semiconductor layer due to the heat produced when the third semiconductor layer, the insulation film, and the conductive layer are formed. This has an advantage of providing the semiconductor device having a small on-state resistance and a high breakdown voltage as the vertical MOSFET.

In accordance with the fourth aspect of the present invention, the second semiconductor layer is mainly formed of the epitaxial growth layer of the same conductivity type as the first semiconductor layer whose impurity concentration is higher than that of the epitaxial growth layer. For the film formed by the epitaxial growth, about ±10% variations in impurity concentration (or resistivity) and thickness are inevitably produced. However, if the impurity concentration itself of the epitaxial growth layer to be formed is small, the absolute values of those variations become small. Thus, the variations in both resistivity and thickness of the second semiconductor layer are suppressed. Besides, a predetermined impurity implanted in the second semiconductor layer is diffused in the second semiconductor layer due to the heat applied to the first and second semiconductor layers in diffusion for forming the diffusion layer, so that the impurity concentration of the second semiconductor layer becomes higher than the second impurity concentration but lower than the first impurity concentration. Since variations in dose of the predetermined impurity is small in this case, the variations in impurity concentration of the second semiconductor layer eventually become small. Further, since the impurity of the first conductivity type moves (or floats) from the first semiconductor layer to the second semiconductor layer due to the heat generated by the process for forming the first and second main electrodes, because of the influence of this movement and the diffusion of the predetermined impurity as described above, the concentration distribution in the second semiconductor layer except the diffusion layer decreases monotonically from the surface side of the second semiconductor layer and reaches its minimum in the vicinity of the interface between the first and second semiconductor layers. Since the second semiconductor layer has such concentration distribution of impurity, it becomes possible to sufficiently suppress both the reduction in thickness and the increase in resistivity of the second semiconductor layer due to the movement of the impurity, as compared to the conventional semiconductor device which fails to have such concentration distribution. As a result, the variations in impurity concentration and thickness of the second semiconductor layer can be reduced to an enough level for practical applications, which brings about the effect that the variations in device characteristics such as on-state resistance and breakdown voltage can be reduced as well to an enough level for practical applications. In addition, the reduction in variations in impurity concentration and thickness of the second semiconductor layer leads to the reduction in variations in impurity concentration (surface concentration) on the surfaces of the diffusion layer and the second semiconductor layer. Thus, the application of the semiconductor device of the present invention as a part of the semiconductor device having a MOS gate makes it possible to reduce the variations both in surface concentration of the channel region and in threshold voltage, thereby stabilizing the semiconductor characteristics.

Since the impurty concentration of the epitaxial growth layer is relatively low in the second step of the fifth aspect of the present invention, the absolute values of the variations in impurity concentration and film thickness due to the epitaxial growth are small, even if the degree (%) of those variations is almost the same with that in conventional intermediate concentration (corresponding to the third impurty concentration). Thus, the variations in impurity concentration a nd thickness of the second semiconductor layer at the second step become smaller than the conventional values.

Further, since the predetermined impurities of the first conductivity type are implanted and diffused by thermal treatment at the third step of the fifth aspect of the present invention, the second semiconductor layer is changed to have a third impurity concentration corresponding to an intermediate impurity concentration, with the increase of variations in impurity concentration (resistivity) and thickness both suppressed. The advantage of forming the second semiconductor layer having the intermediate impurity concentration out of the epitaxial layer by ion implantation is summarized as follows: Since the concentration distribution of impurity of the first conductivity type, obtained by the diffusion of the implanted predetermined impurity, decreases monotonically from the surface in a depth direction, the influence of the impurity of the first conductivity type diffusing from the first semiconductor layer to the second semiconductor layer by thermal treatment (i.e. reduction in thickness and increase in resistivity of the second semiconductor layer) can be suppressed at the next step. Thus, the increase of variations in impurity concentration and thickness of the second semiconductor layer due to the influence can be suppressed as compared to the conventional technique.

Therefore, in accordance with the fifth aspect of the present invention, the variations in both impurity concentration and thickness of the second semiconductor layer due to the element manufacture can be reduced to an enough level for practical applications, which enables the production of the semiconductor device having small variations in both on-state resistance and breakdown voltage. Further, such a method for manufacturing a semiconductor device having small variations in its characteristics accomplishes the reduction in manufacturing cost.

In accordance with the six aspect of the present invention, the variations in dose of the predetermined impurity implanted in the second semiconductor layer can be suppressed by the ion-implantation step, which considerably distributes to the reduction in variations in impurity concentration of the second semiconductor layer.

In accordance with the seventh aspect of the present invention, the third semiconductor layer, the insulation film, and the conductive layer can be formed, with the influence of the impurity of the first conductivity type which diffuses (or floats) from the first semiconductor layer to the second semiconductor layer due to the heat produced when those layers are formed, reduced. Thus, it is possible to produce the vertical MOSFET having small variations in characteristics such as threshold voltage with high yield.

The purpose of the present invention is to provide a semiconductor device which reduces variations due to the epitaxial growth in the element manufacture and variations in impurity concentration and thickness of the epitaxial growth layer due to the float of impurity from the substrate in the thermal treatment. The semiconductor device further reduces the variations in semiconductor characteristics such as on-state resistance and breakdown voltage.

Another purpose of the present invention is to provide a manufacturing method of the above-described semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
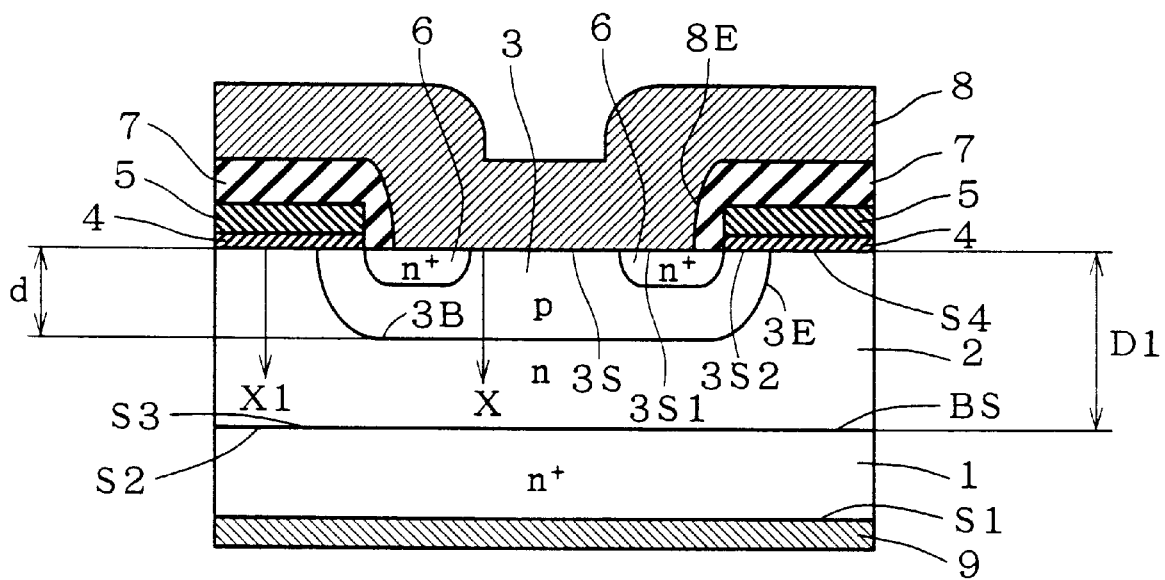
FIG. 1 is a sectional view showing a structure of a emiconductor device in accordance with a first preferred embodiment of the present invention.

FIG. 1 is a longitudinal sectional view showing a structure of a vertical MOSFET which is one of semiconductor devices in accordance with a first preferred embodiment of the present invention.

In FIG. 1, a first semiconductor layer 1 of a first conductivity type (n-type) having a high first impurity concentration, has a first major surface S1 and a second major surface S2 opposed to the first major surface S1. A second semiconductor layer 2 of the first conductivity type having a second impurity concentration lower than the first impurity concentration, has a third major surface S3 forming an interface BS with the second major surface S2 and a fourth major surface S4 opposed to the third major surface S3. A well, or diffusion layer, 3 of a second conductivity type (p-type) is formed from a part of the fourth major surface S4 to a depth d inside the second semiconductor layer 2. Further, a first main electrode (drain electrode) 9 is formed on the first major surface S1, while a second main electrode (source electrode) 8 is formed on a surface 3S of the well 3, that is, on a part of the fourth major surface S4. Then, a third semiconductor layer 6 of the first conductivity type (n type) having a high impurity concentration is formed from a part of the surface 3S of the well 3, including a first portion 3S1 forming an interface with an edge portion 8E of the second main electrode 8 and a part of a second portion 3S2 which is adjoining to the first portion 3S1 and on which the second electrode 8 is not formed, to a predetermined depth inside the well 3. Further, an insulating film 4, and a conductive layer 5 to be a gate electrode or third main electrode, are sequentially formed on the other part of the second portion 3S2 out of the surface 3S of the well 3. Then, an interlayer insulation film 7 is formed so as to coat the insulating film 4 and the conductive layer 5. The surface of the interlayer insulation film 7 is coated by the first main electrode 8.

The second semiconductor layer 2 (n), mainly composed of an epitaxial growth layer having a lower impurity concentration (n−) than the second impurity concentration (n), is formed by implanting and diffusing a predetermined impurity ion of the first conductivity type such as phosphorous in the epitaxial growth layer, so as to have the second impurity concentration. Because of this implanted and diffused impurity ion of the first conductivity type such as phosphorous, the concentration distribution of impurity in the second semiconductor layer becomes peculiar, which will be described later in detail. This is the inventive point of the present device. Further, the thermal treatment in diffusion for forming the well 3 distributes to the diffusion of the implanted predetermined impurity ion.

Figure 2:
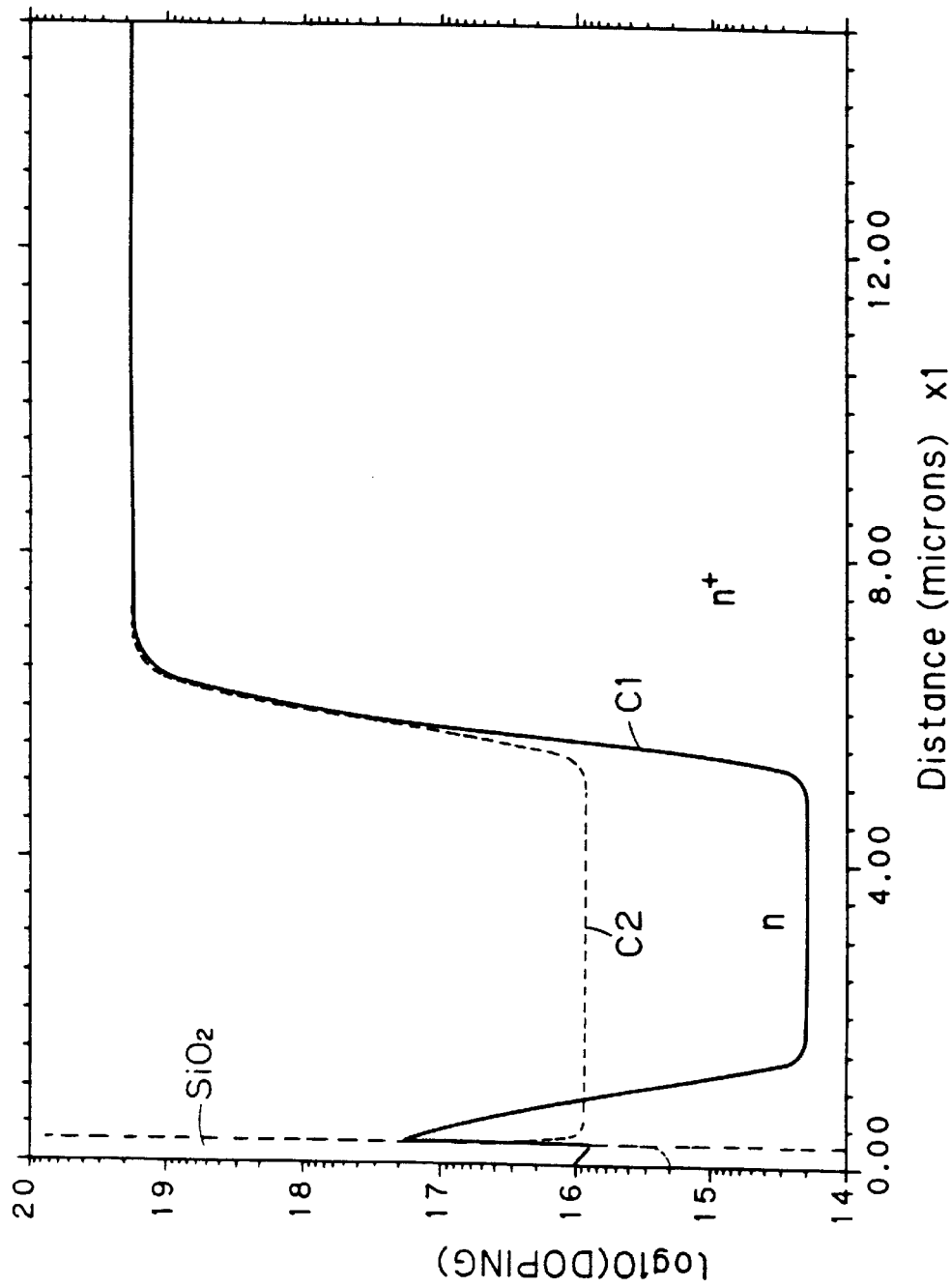
FIGS. 2 through 4 illustrate a concentration distribution of impurity in the semiconductor device of the first preferred embodiment, in comparison with the conventional technique.

FIG. 2 shows a simulation result of the concentration distribution of impurity of the first conductivity type in the second semiconductor layer 2 except both the well 3 and a part directly under the well 3 shown in FIG. 1 after the implanted phosphorous ion is diffused, in the device having a breakdown voltage of 30 V. The solid line C1 indicates the present case, and the broken line C2 indicates the conventional case for comparison. The horizontal axis indicates a depth X1 of FIG. 1, including the insulation film ($SiO_2$ film) 4 on the surface.

Figure 3:
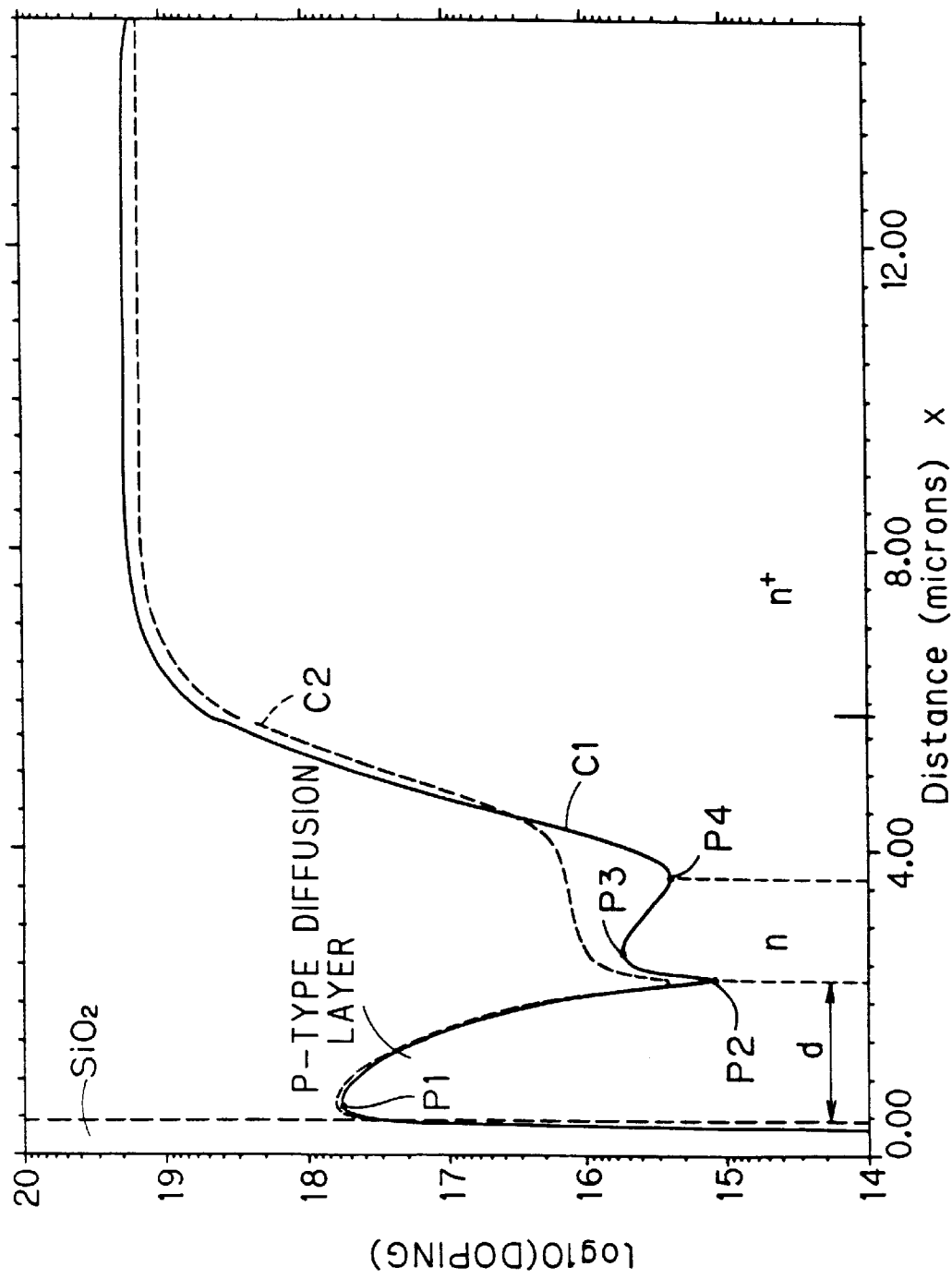
Figure 4:
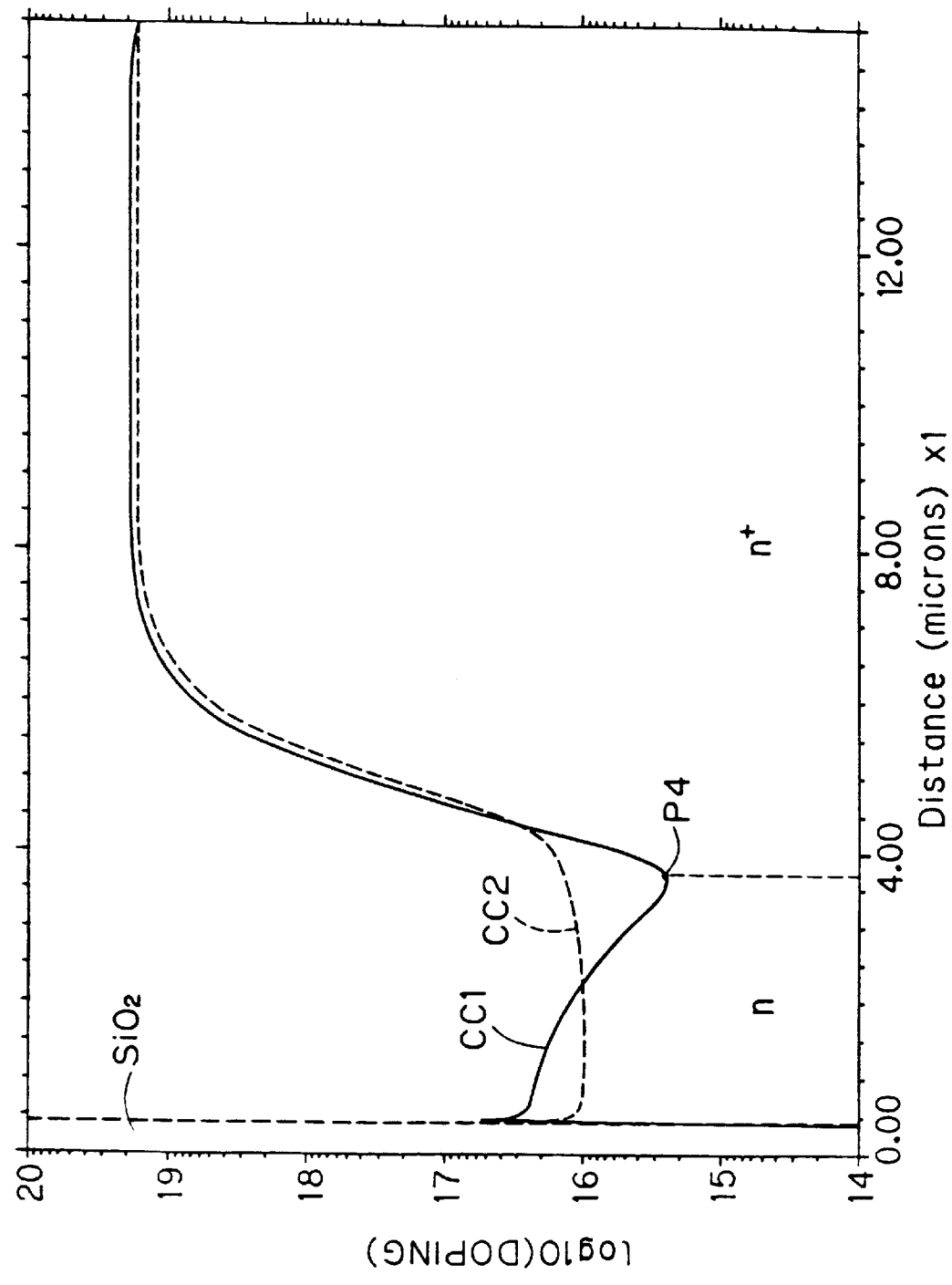

FIGS. 3 and 4 show simulation results of the concentration distribution of impurity after all the layers 4 through 9 are formed next to the well 3. More specifically, FIG. 3 is a profile of the concentration distribution of impurity from the surface 3S of the well 3 of FIG. 1 to the interface BS just below the well 3, and the horizontal axis indicates X of FIG. 1; FIG. 4 is a profile of the concentration distribution of impurity of the first conductivity type in the semiconductor layer 2 except the well 3, and the horizontal axis indicates X1 of FIG. 1. The solid lines C1 and CC1 of FIGS. 3 and 4, respectively, indicate the present case, while the broken lines C2 and CC2 of FIGS. 3 and 4, respectively, indicate the conventional case for comparison.

As shown in FIG. 3, in the device of the present invention, the concentration distribution of impurity from the surface 3S of the well 3 to the interface BS just below the well 3, shows a first maximum P1 on the side of the surface 3S, a first minimum P2 at the bottom surface 3B of the well 3, a second maximum P3 in the vicinity of the bottom surface 3B of the well 3 within the second semiconductor layer 2, and a second minimum P4 in the vicinity of the interface BS.

As shown in FIG. 4, in the device of the present invention, the second impurity concentration in the second semiconductor layer 2 except the well 3 distributes in a depth direction, decreasing monotonically from the side of the fourth major surface S4 and reaching its minimum in the vicinity of the interface BS.

Based on the fact that the second impurity concentration n ranges from $1 \times 10^{15}$ cm$^{-3}$ to $1 \times 10^{16}$ cm$^{-3}$, the results of FIGS. 2 through 4 show that the thickness of the second semiconductor layer 2, excluding the thickness (0.3 $\mu$m) of the $SiO_2$ film, before the layers 4 through 9 are formed is about 4.1 $\mu$m because of little influence of the float of a high concentration of impurity, and the thickness D1 of the second semiconductor layer 2 after all the layers 4 through 9 are formed is about 4.0 $\mu$m. Thus, it is understood that the decrease in thickness of the second semiconductor layer 2, or the increase in resistivity, due to the float can be sufficiently suppressed in the device of the present invention. On the other hand, in the conventional device, FIG. 3 shows that the thickness of the layer corresponding to the second semiconductor layer 2 after all the layers 4 through 9 are formed is about 2.3 $\mu$m, providing little space between the layer and the bottom surface of the well. This indicates that the influence of the float is considerably serious in the conventional device.

This comparison result indicates that, in the device of the present invention having such concentration distribution of impurity as shown in FIGS. 2 through 4, the predetermined impurity ion to be implanted and diffused in the second semiconductor layer acts to suppress the diffusion or penetration of impurity from the first semiconductor layer due to the float. Thus, the reduction in thickness and the increase in resistivity of the second semiconductor layer can be sufficiently suppressed in the semiconductor device having the structure with the elements formed as shown in FIG. 1. Further, even if there are variations in impurity concentration and thickness in the element manufacture, their further increase due to the float can be effectively suppressed. This provides the vertical MOSFET with the second semiconductor layer having small variations in impurity concentration and thickness as compared to the conventional device. As a result, it becomes possible to obtain the vertical MOSFET having small variations in characteristics such as on-state resistance and breakdown voltage (breakdown voltage at the pn junction), which makes it possible to reduce variations in surface concentration in a channel region, and further to reduce variations in threshold voltage.

Though the structure shown in FIG. 1 is the vertical MOSFET, the features of the present invention, directed to the layers 1 through 3, can be applied to a diode having a p–n–n$^+$ structure in the same way. Further, the basic concept of the present invention can be applied to both the diode and the vertical MOSFET, having an n–p–p$^+$ structure.

2. Second Preferred Embodiment

Figure 12:
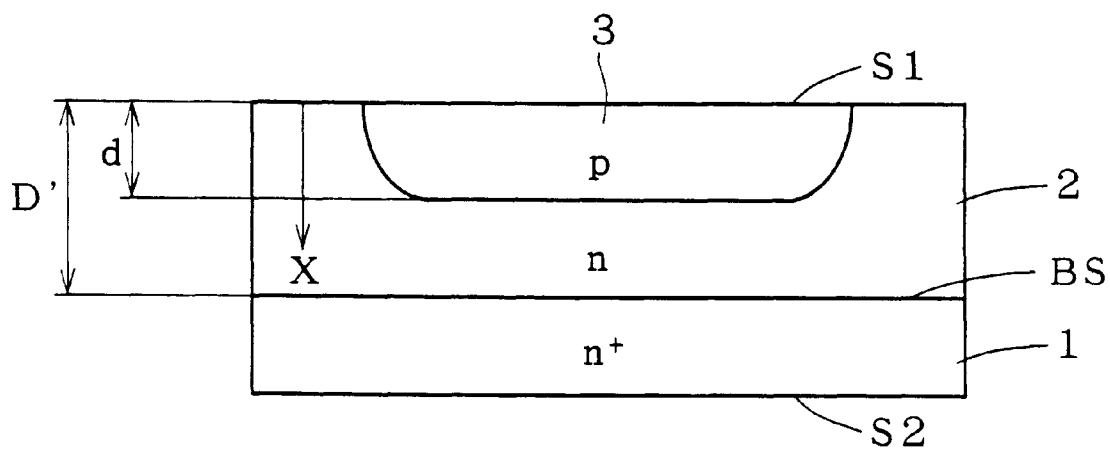
Figure 13:
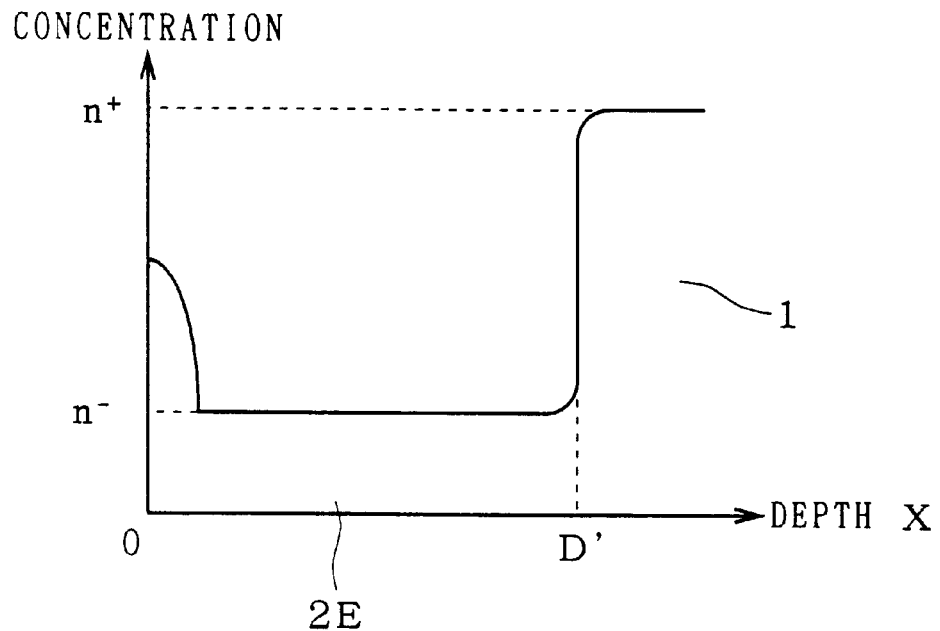
FIG. 13 illustrates correlation between the impurity concentration and the depth after the corresponding step in accordance with the second preferred embodiment.

A second preferred embodiment of the present invention is directed to a manufacturing method of the semiconductor device described in the first preferred embodiment of the present invention. As an example of the semiconductor device having a pn junction, the manufacturing method of the vertical MOSFET will be described with reference to figures. FIGS. 5, 6, 8–12, 14–19 are longitudinal sectional views showing manufacturing, steps of the vertical MOSFET; FIGS. 7, 13 and 20 schematically show correlation between the impurity concentration and the depth from a first surface S1 (see FIG. 5) after the corresponding step.

2-1. First Step

Figure 5:
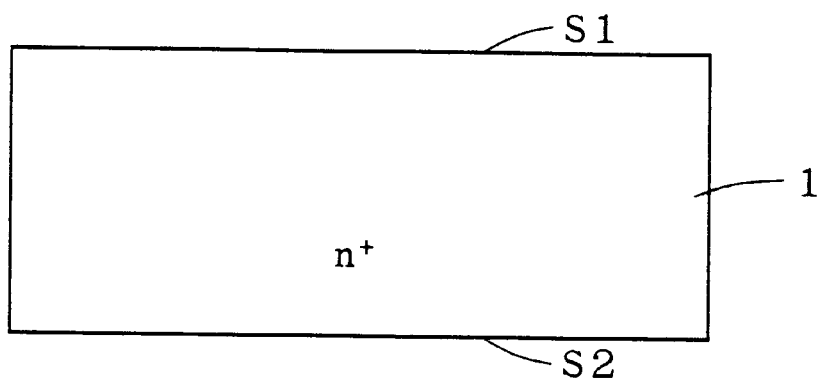
FIGS. 5 and 6 are sectional views showing a manufacturing process of a semiconductor device having a MOS gate in accordance with a second preferred embodiment of the present invention.

As shown in FIG. 5, an n-type silicon substrate 1 having the first impurity concentration of $1 \times 10^{18}$ cm$^{-3}$ to $1 \times 10^{19}$ cm$^{-3}$ is prepared. In this description, the n-type corresponds to the first conductivity type, while the p-type corresponds to the second conductivity type. Thus, the n-type silicon substrate 1 is referred to also as a semiconductor layer of the first conductivity type, indicated by n$^+$ in FIG.

2-2. Second Step

Figure 6:
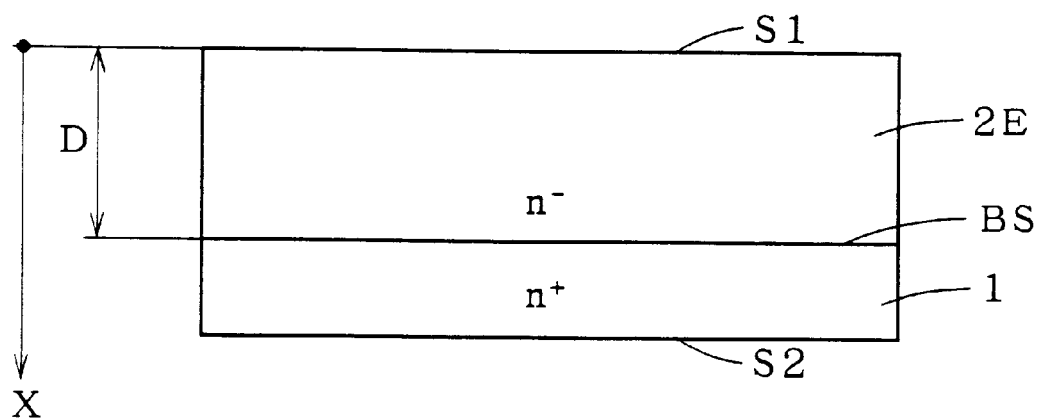
Figure 7:
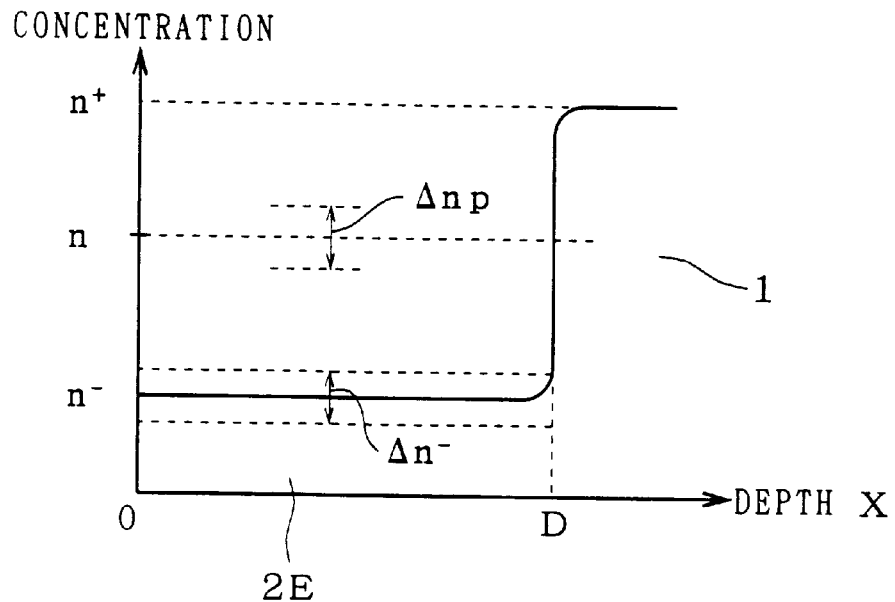
FIG. 7 illustrates correlation between the impurity concentration and the depth after the corresponding step in accordance with the second preferred embodiment.

An n-type n$^-$ layer 2E having the second impurity concentration of $1 \times 10^{14}$ cm$^{-3}$ to $1 \times 10^{15}$ cm$^{-3}$ and thickness D is epitaxially grown as the second semiconductor layer of the first conductivity type, from the first surface S1 of the n-type silicon substrate 1 to the inside thereof as shown in FIG. 6. The first surface S1 is equivalent to the surface of the n$^-$ layer 2E.

FIG. 7 shows the concentration distribution of impurity (doping profile) in the n$^-$ layer 2E from the first surface S1 to a predetermined depth. As noted in the conventional problems, the epitaxial growth causes about ±10% variations in impurity concentration and thickness of the epitaxial growth layer. However, since the impurity concentration of the epitaxial growth layer is reduced by more than one order as compared to the conventional impurity concentration, the absolute value of the variations itself becomes smaller than the conventional value even with the 10% variations. FIG. 7 shows this point, using the variation value Δnp for the conventional case and the variation valueΔn$^-$ for the present case. The relation Δn$^-$<Δnp holds for these values.

Instead of the n$^-$ layer 2E, an n$^{--}$ layer having a lower impurity concentration (less than $1 \times 10^{14}$ cm$^{-3}$) may be used as the second semiconductor layer having the second impurity concentration.

2-3. Third Step

In this step, the second semiconductor layer having a third impurity concentration (medium concentration) higher than the second impurity concentration (low concentration) but lower than the first impurity concentration (high concentration) is formed by implanting a predetermined n-type impurity only into the second semiconductor layer after the epitaxial growth from its surface and diffusing the implanted impurity by thermal treatment in the second semiconductor layer. As a method for diffusing the predetermined impurity by thermal treatment, the diffusion processing or step for forming the p-type well from the first major surface of the second semiconductor layer to a predetermined depth d (<D), is used. This positive and effective use of the applicable conventional processes improves practicability and flexibility of this step, which will be described in detail.

Figure 8:
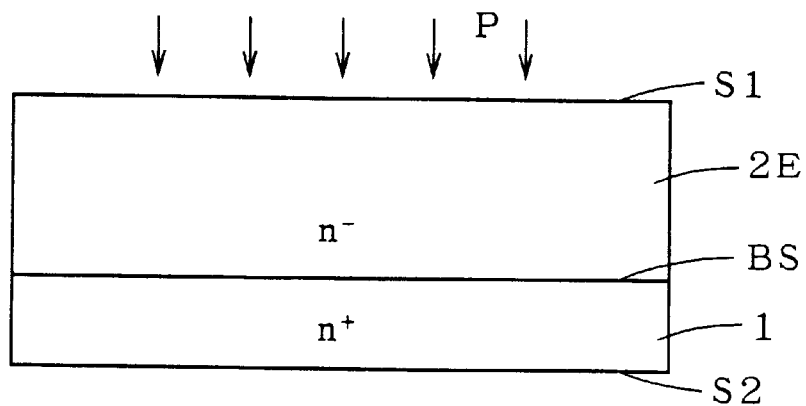
FIGS. 8 through 12 are sectional views showing a manufacturing process of the semiconductor device having the MOS gate in accordance with the second preferred embodiment.

As shown in FIG. 8, phosphorous (P) is ion-implanted as predetermined impurity at a dose of about $5 \times 10^{12}$ cm$^{-2}$ from the surface of the n$^-$ layer 2E, that is, from the first surface S1, to the inside thereof. The phosphorous used as predetermined impurity may be substituted by other impurity donors.

Then, a p-type impurity region, that is, a p-type well having an impurity concentration of $1 \times 10^{16}$ cm$^{-3}$ to $1 \times 10^{17}$ cm$^{-3}$ is formed by using the well forming step in the conventional technique shown in FIGS. 23 through 26. However, since the phosphorus ions are implanted in the n$^-$ layer 2E in this preferred embodiment, the concentration distribution of impurity in the n$^-$ layer 2E after the well forming step becomes different from that in the conventional technique. The detail will be described in the following.

Figure 9:
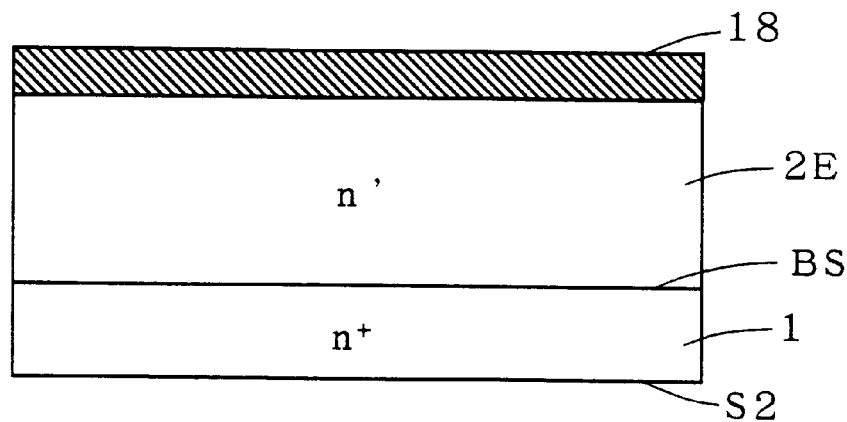

An oxide film, a SiO$_2$ film 18 in this case, is formed by thermal oxidation on the first surface S1 of the n$^-$ layer 2E (FIG. 9). The phosphorus ions implanted in the previous process are diffused to the interface BS by thermal treatment, and further the n-type impurities are slightly diffused from the n-type silicon substrate 1 to the first surface S1. Thus, the impurity concentration (n') of the n$^-$ layer 2E after the SiO$_2$ film 18 is formed is a little higher than the second impurity concentration (n>n'>n$^-$).

Figure 10:
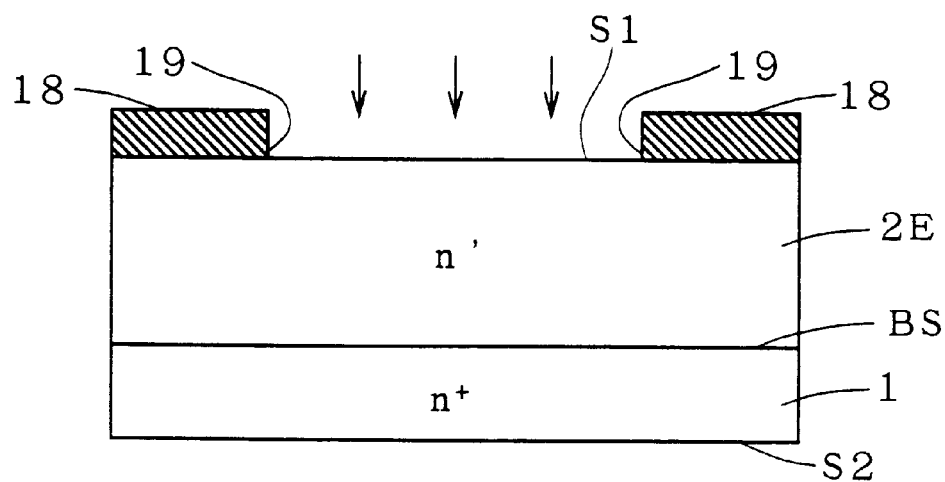
Figure 11:
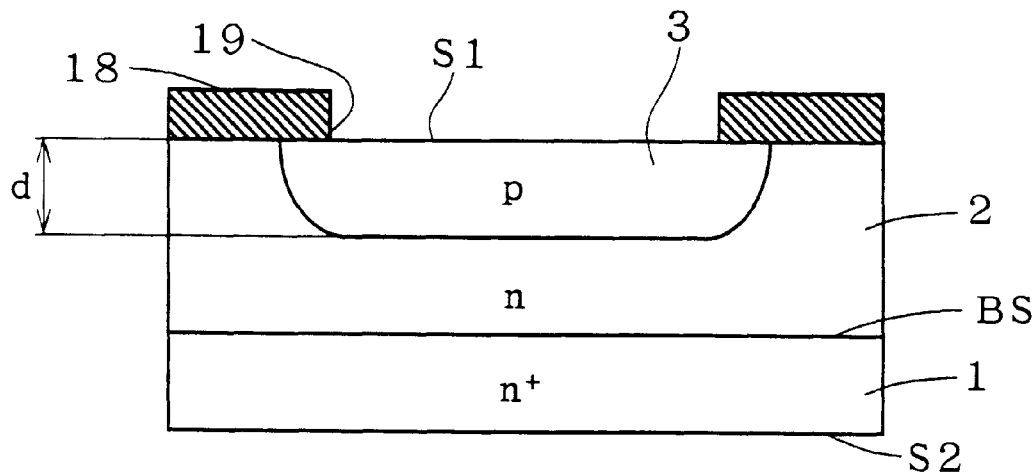

Next, as shown in FIG. 10, an opening hole 19 is formed in a part of the SiO$_2$ film 18. Using this opening hole 19, p-type impurities are ion-implanted from the exposed surface S1 to the inside thereof. Then, with the diffusion at a predetermined temperature, a p-type well 3 is formed from the surface S1 to a depth d as shown in FIG. 11. The surface SI of the n$^-$ layer is equivalent to the surface of the p-type well 3. Then, the SiO$_2$ film 18 is removed (FIG. 12).

The thermal treatment in diffusion enhances the diffusion of the phosphorus ion from the surface S1 to the interface BS, and slightly increases the diffusion of the n-type impurity from the n-type silicon substrate 1 to the interface BS. As a result, the n$^-$ layer 2E of FIG. 6 becomes an n layer 2 having a higher third impurity concentration ($1 \times 10^{15}$ cm$^{-3}$ to $1 \times 10^{16}$ cm$^{-3}$) as shown in FIG. 12. Since the impurities are slightly diffused from the n-type silicon substrate 1 in this case, the thickness D' of the n layer 2 is a little thinner than the thickness D. FIG. 13 shows the concentration distribution of impurity in the n layer 2 except the p-type well 3, from the surface S1 to a depth X. As shown in this dose profile, the concentration distribution of impurity in the n layer 2 monotonically decreases as the depth from the surface S1 increases, so that the distribution becomes almost constant. This is because of the influence of the diffusion of the implanted phosphorous ion.

2-4. Fourth Step

Figure 14:
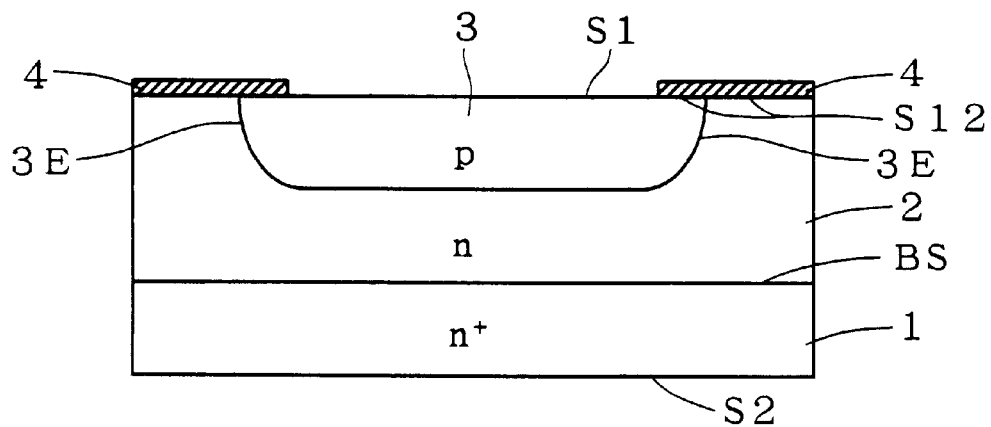
FIGS. 14 through 19 are sectional views showing a manufacturing process of the semiconductor device having the MOS gate in accordance with the second preferred embodiment.
Figure 15:
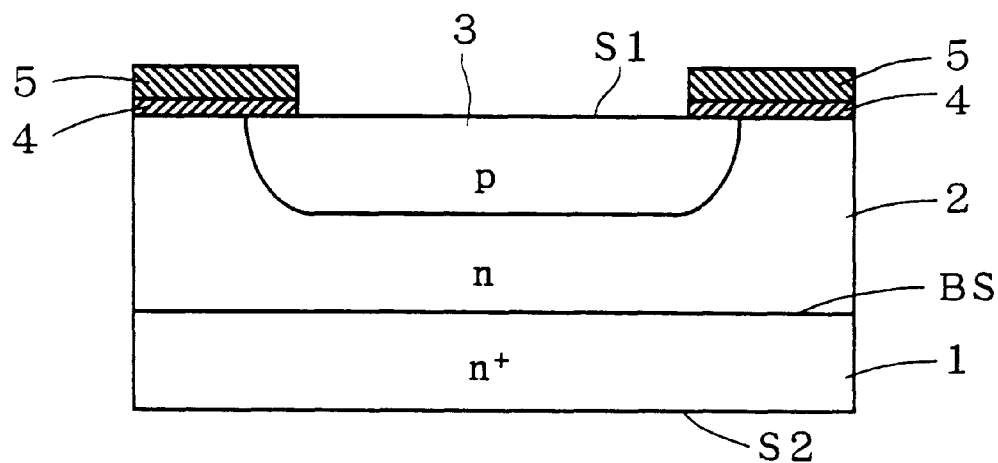
Figure 16:
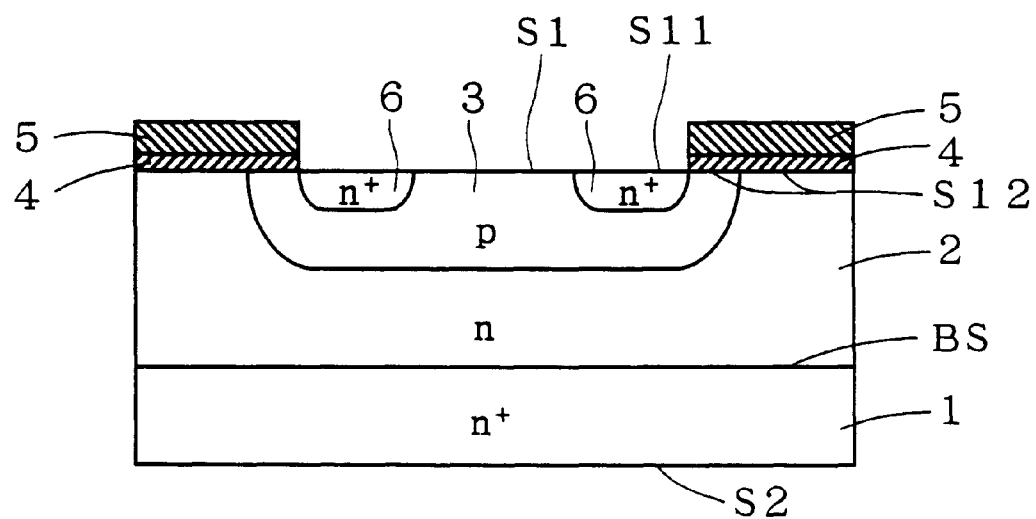
Figure 17:
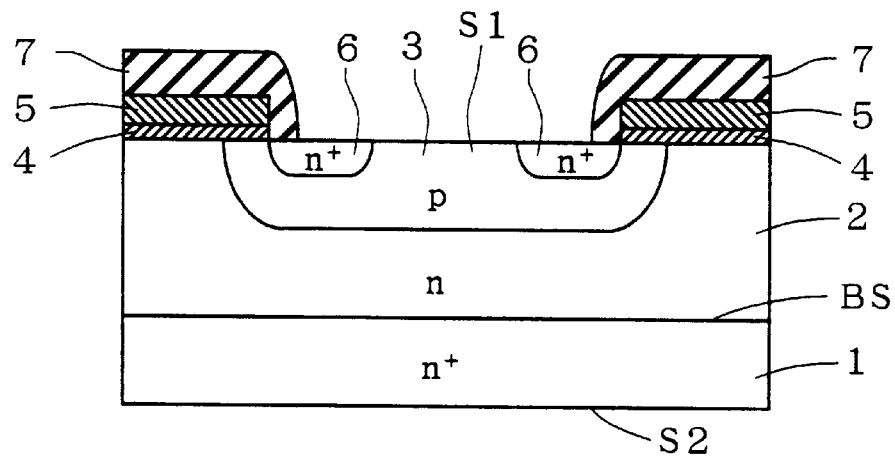
Figure 18:
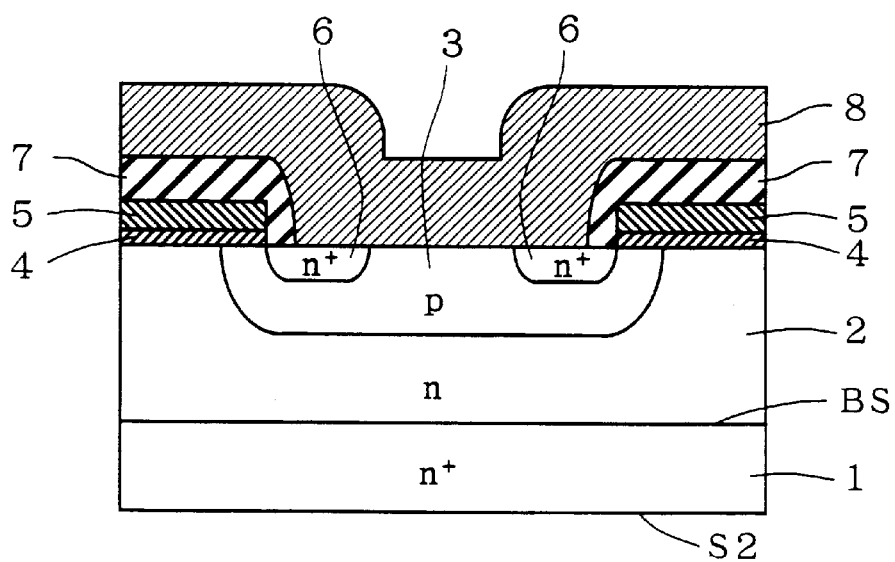

Next, a gate insulation film 4 of about 1,000 angstroms is formed by thermal oxidation on a surface portion (second surface portion S12 out of the surface S1) of both the periphery of the edge portion 3E of the p-type well 3, and the n layer 2 outside the periphery (FIG. 14). Further, a polycrystalline silicon layer (conductive layer) 5 of about 3,000 to 5,000 angstroms to be a gate electrode (third main electrode) is formed on the surface of the gate insulation film 4 (FIG. 15). Then, an $n^+$ source impurity region (third semiconductor layer) 6 having an impurity concentration of $1 \times 10^{19}$ cm$^{-3}$ to $1 \times 10^{20}$ cm$^{-3}$ is formed from the surface of a portion (first surface portion S1 out of the surface S1 of the p-type well 3), which is adjoining to the gate insulation film 4 and sandwiched between the polycrystalline silicon layers 5, to the inside of the p-type well 3 (FIG. 16). Further, an interlayer insulation film 7 is selectively formed on the surface of the polycrystalline silicon layer 5 and on a surface portion adjoining to the gate insulation film 4 out of the surface of the $n^+$ source impurity region 6, so as to coat the layers 4 and 5 (FIG. 17).

2-5. Fifth Step

Figure 19:
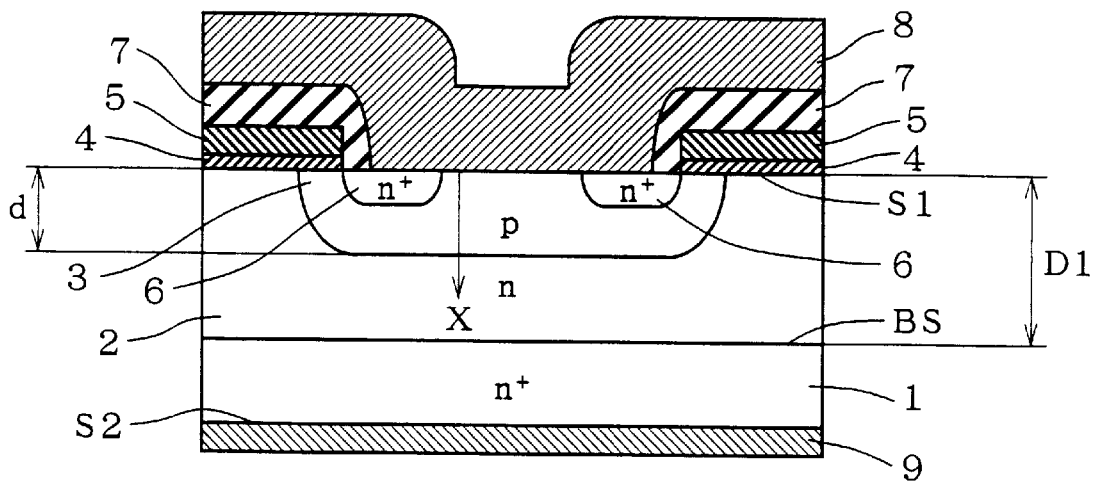
Figure 20:
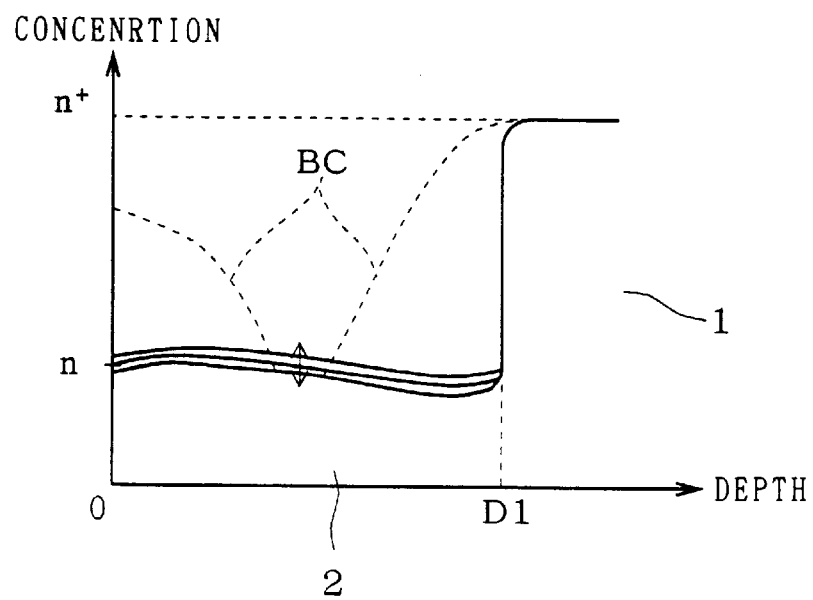
FIG. 20 illustrates correlation between the impurity concentration and the depth after the corresponding step in accordance with the second preferred embodiment.
Figure 21:
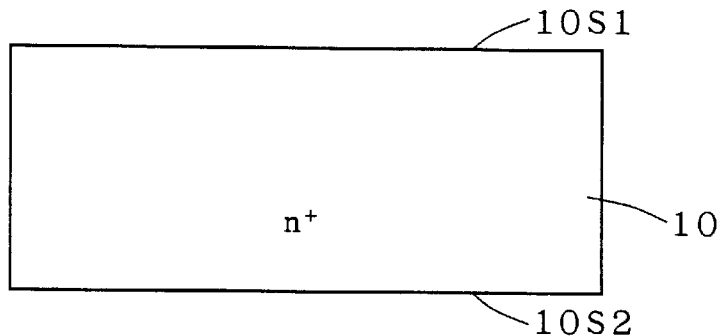
FIGS. 21 through 32 are sectional views showing a manufacturing process of the conventional vertical MOS-FET.
Figure 22:
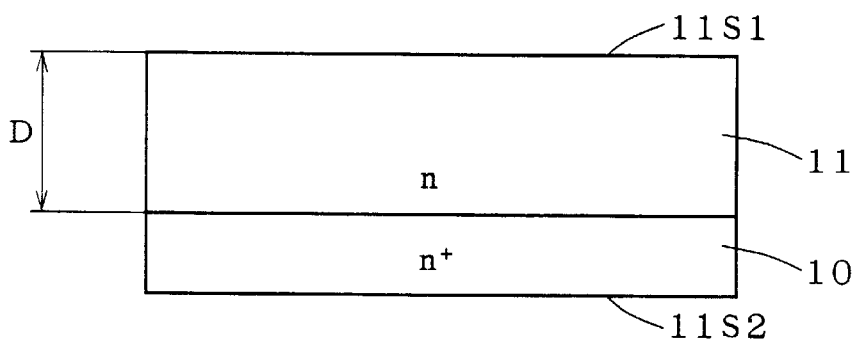
Figure 23:
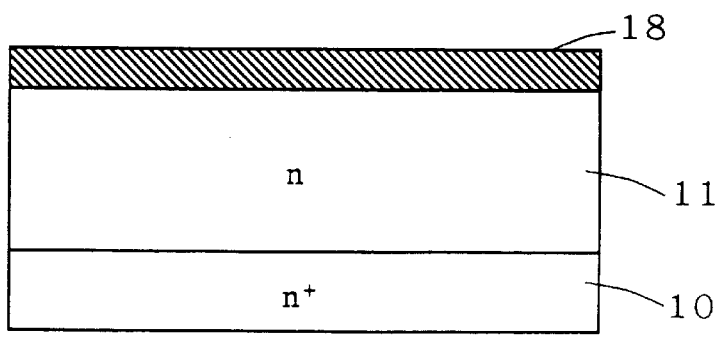
Figure 24:
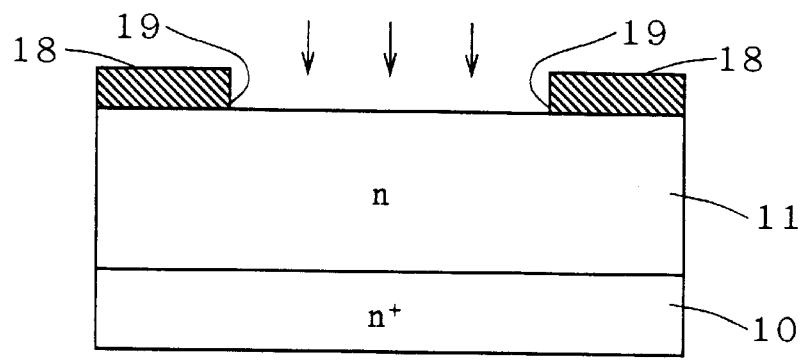
Figure 25:
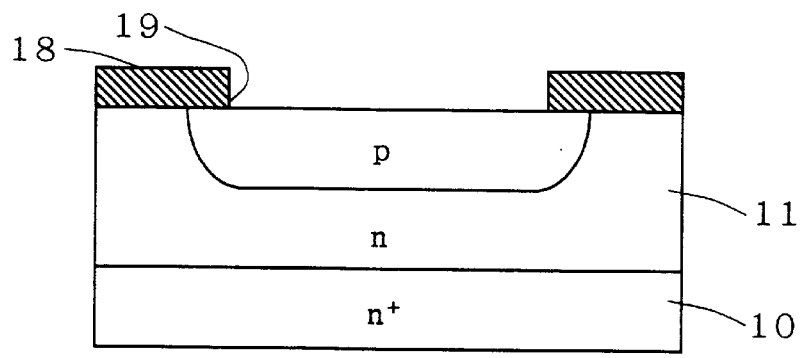
Figure 26:
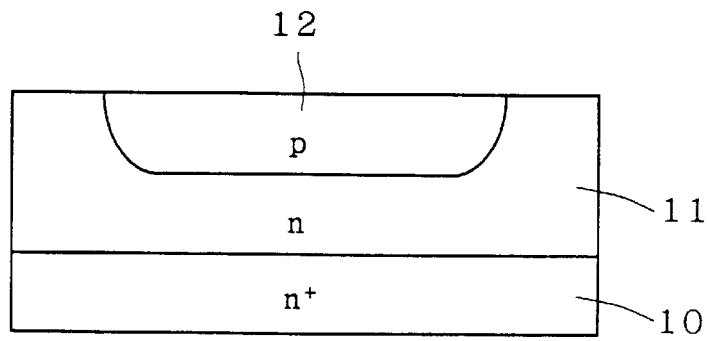
Figure 27:
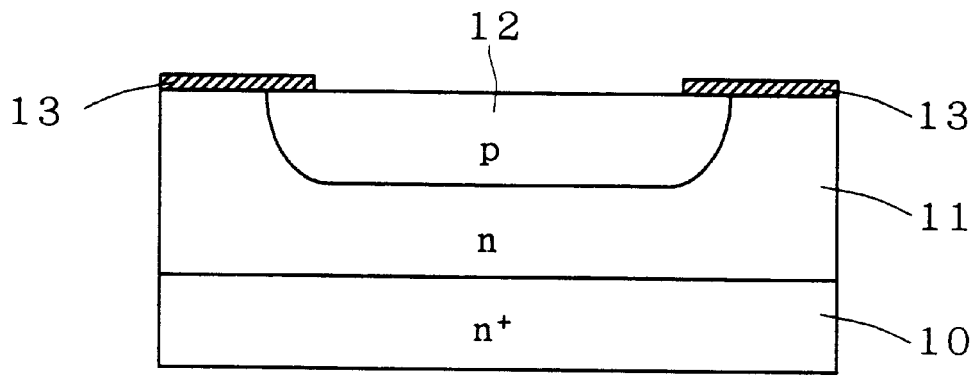
Figure 28:
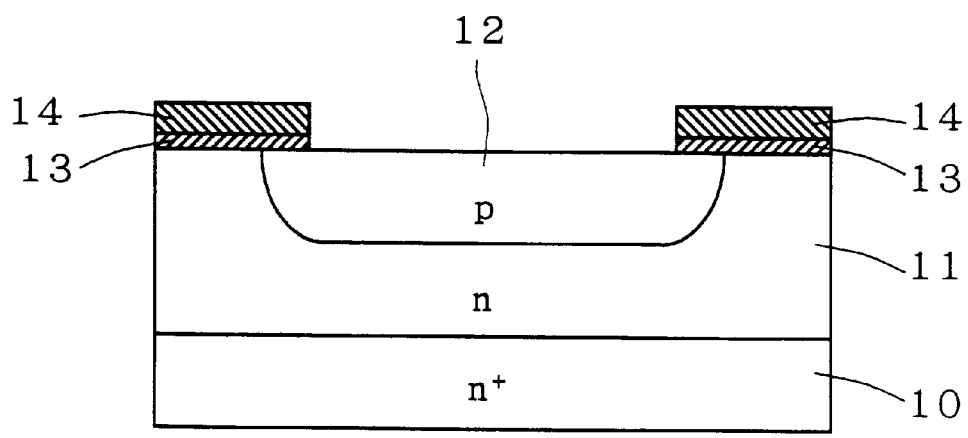
Figure 29:
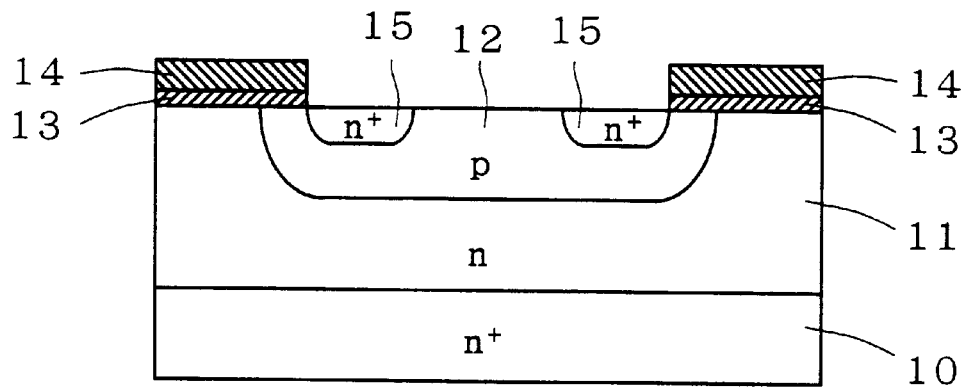
Figure 30:
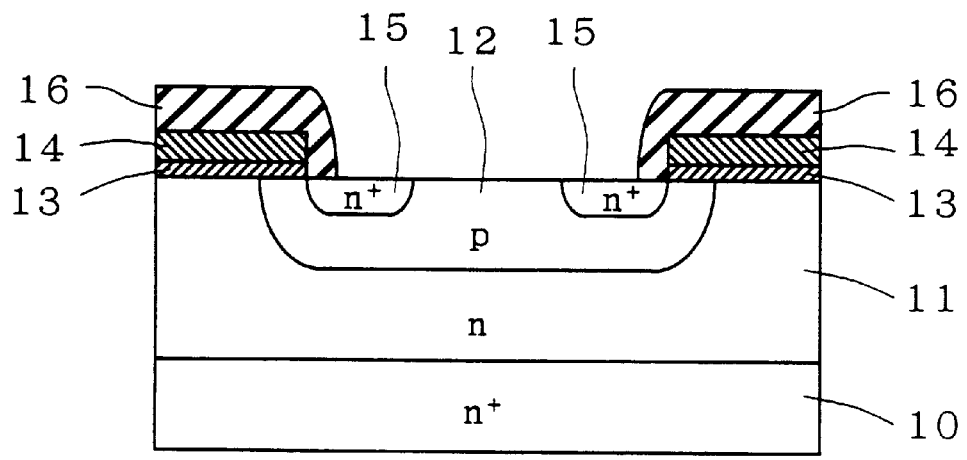
Figure 31:
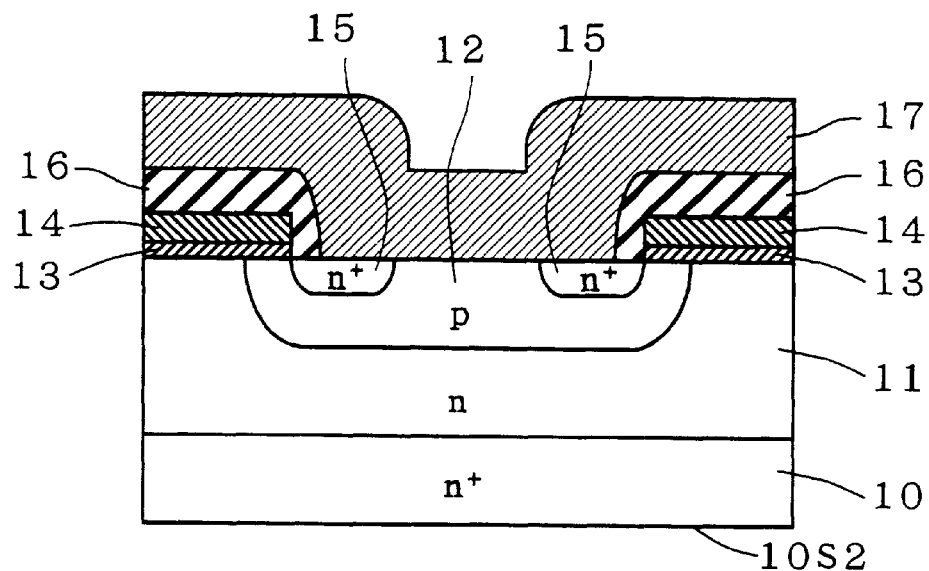
Figure 32:
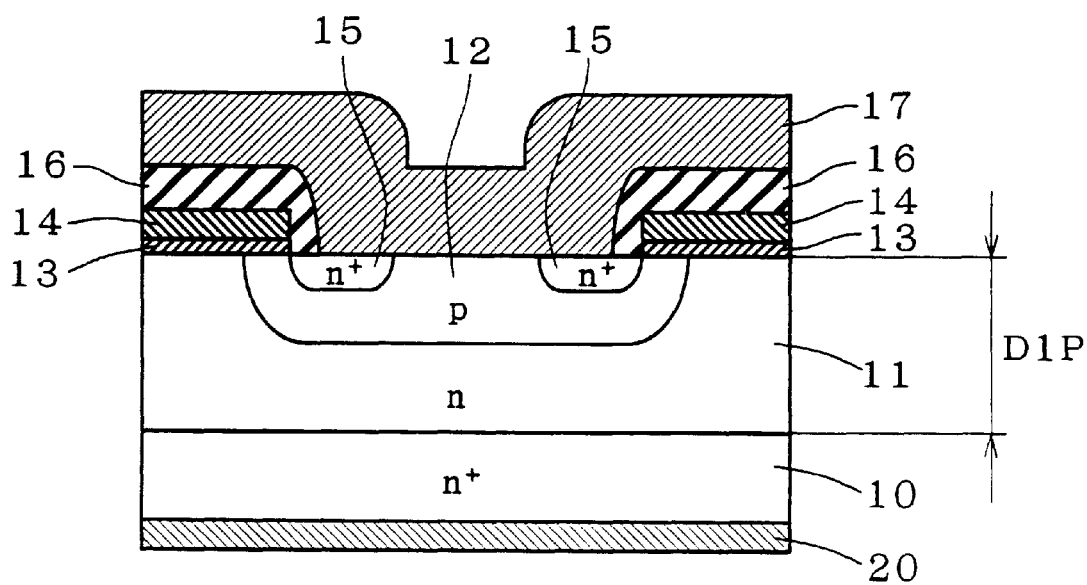

A source electrode 8 to be a first main electrode is formed on the surface of the interlayer insulation film 7 and on the exposed surface S1 of the p-type well 3 (FIG. 18), while a drain electrode 9 to be a second main electrode is formed on the second major surface S2 of the n-type silicon substrate 1 (FIG. 19). This forms the vertical MOSFET.

The thermal treatment at the fourth and fifth steps remarkably causes the diffusion (float) of impurity from the n-type silicon substrate 1 to the n layer 2. However, since the phosphorous ions are diffused in the n layer 2 at the third step, and the heat produced at the fourth and fifth steps further enhances the diffusion of the phosphorous ions toward the interface BS within the n layer 2, thereby a diffusion in the opposite direction, that is, the diffusion due to the float of the impurity described above, is suppressed. Thus, as shown in FIG. 20, the concentration distribution of impurity from the surface S1 to the depth X reaches its maximum on the side of the surface S1 and reaches its minimum on the side of the interface BS. This indicates that the influence of the float is small in this preferred embodiment compared to the conventional case. For all that, complete suppression of the float is impossible, so that the thickness D1 (FIG. 19) of the n layer 2 after the element manufacture inevitably becomes thinner than the original thickness D (FIG. 6). The relation D1P<D1<D, however, still holds for this case.

In the conventional technique, the epitaxial growth of the n layer causes the variations in resistivity and thickness as described above, which are tolerable up to about ±10%, respectively. Since the thermal treatment in element manufacture causes the float of a high concentration of impurity from the n-type silicon substrate, the resistivity of the n layer is further increased for the element whose resistivity varies upward in the epitaxial growth; while the thickness of the n layer is further reduced for the element whose resistivity varies downward in the epitaxial growth.

In the manufacturing process of this preferred embodiment, however, an $n^-$ or $n^{--}$ layer having a low impurity concentration is epitaxially grown. Thus, as compared to the case where the n layer itself is epitaxially grown, the variations in impurity concentration becomes small. Further, though the n layer is formed by ion implantation of impurity such as phosphorous, the variations in dose itself becomes small in that case. Thus, the variations in impurity concentration of the n layer with the p-type well formed can be suppressed (see FIG. 20). That is, in this preferred embodiment, even if the thermal treatment in the element manufacture causes the float of a high concentration of impurity from the substrate, it is possible to obtain the n layer having small variations in impurity concentration and thickness as a base or main material of the epitaxial growth layer. As a result, the variations in characteristics such as on-state resistance or breakdown voltage, which is important for the device having a pn junction, can be further reduced.

Further, since the variations in impurity concentration and thickness of the n layer become smaller, the variations in surface concentration after the p-type well is formed in the next step can be reduced as well. This reduces variations in impurity concentration of the channel region and variations in threshold voltage, thereby improving the manufacturing yield.

Though FIGS. 5 through 20 shows the example that the n-type epitaxial layer is grown on the n-type silicon substrate having a high impurity concentration, the manufacturing method of the present invention can be basically applied to the case where a p-type epitaxial layer is grown on a p-type silicon substrate a high impurity concentration. In that case, the same effect can be obtained.

The technical concept of the respective steps described in this preferred embodiment is applicable to the manufacturing method not only of the vertical MOSFET but also of a diode having a pin structure. In that case, the same effect can be obtained.

As described above, according to the manufacturing method of this preferred embodiment, the second semiconductor layer of the first conductivity type having a low impurity concentration ($n^-$) is epitaxially grown from the surface of the first semiconductor layer of the first conductivity type having a high impurity concentration ($n^+$), to finally form a medium concentration (n) of the second semiconductor layer by implanting and diffusing the impurity of the same conductivity type as the second semiconductor layer from the surface of the second semiconductor layer to the inside thereof. Thus, even if the element manufacturing steps to be performed later causes the float, the influence thereof can be suppressed. From this, the second semiconductor layer having small variations in both impurity concentration and thickness can be obtained. As a result, the manufacturing method of the present invention makes it possible to produce the semiconductor device having small variations in semiconductor characteristics, thereby improving yield of the semiconductor device and reducing the manufacturing cost.

While the invention has been described in detail, the foregoing description is in all aspects illustrative and not restrictive. It is understood that numerous other modifications and variations can be devised without departing from the scope of the invention.

We claim:

1. A semiconductor device comprising:

a first semiconductor layer of a first conductivity type having a first impurity concentration, said first semiconductor layer having a first major surface and a second major surface opposed to said first major surface;

a second semiconductor layer of said first conductivity type having a second impurity concentration lower than said first impurity concentration, said second semiconductor layer having a third major surface providing an interface with said second major surface, and a fourth major surface opposed to said third major surface;

a well of a second conductivity type provided from a part of said fourth major surface to a predetermined depth inside said second semiconductor layer;

a first main electrode provided on said first major surface; and a second main electrode provided on a surface of said well, wherein said second impurity concentration of said second semiconductor layer except said well distributes in a depth direction, decreasing monotonically from the side of said fourth major surface and reaching its minimum on the side of said interface.

2. The semiconductor device according to claim 1, wherein the concentration distribution of impurity from said surface of said well to said interface just below said well shows a first maximum on the side of said surface of said well, a first minimum at a bottom of said well, a second maximum on the side of said bottom within said second semiconductor layer, and a second minimum on the side of said interface within said second semiconductor layer.

3. The semiconductor device according to claim 2, further comprising:

a third semiconductor layer of said second conductivity type provided from a part of said surface of said well including a first portion providing an interface with an edge portion of said second main electrode and a part of a second portion which is adjacent to said first portion and on which said second main electrode is not provided, to the inside of said well;

an insulation film provided on the other part of said second portion sandwiched between said third semiconductor layer and an edge portion of said well, out of said surface of said well; and a conductive layer provided on said insulation film.

4. A semiconductor device comprising:

a first main electrode;

a first semiconductor layer of a first conductivity type having a first impurity concentration, formed on said first main electrode;

a second semiconductor layer of said first conductivity type having a second impurity concentration, formed on said first semiconductor layer;

a diffusion layer of a second conductivity type, selectively formed from a surface of said second semiconductor layer to the inside thereof; and a second main electrode formed on a surface of said diffusion layer, wherein said second impurity concentration is lower than said first impurity concentration; and wherein said second impurity concentration of said second semiconductor layer immediately under said diffusion layer distributes in a depth direction, increasing monotonically up to a maximum from an interface with said diffusion layer and thereafter decreasing monotonically toward an interface with said first semiconductor layer.

* * * * *